US 008548071B2

(12) United States Patent
Collins

(10) Patent No.: US 8,548,071 B2
(45) Date of Patent: Oct. 1, 2013

(54) INTEGRATED CIRCUIT ENABLING THE COMMUNICATION OF DATA AND A METHOD OF COMMUNICATING DATA IN AN INTEGRATED CIRCUIT

(75) Inventor: Anthony J. Collins, Dublin (IE)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 13/186,415

(22) Filed: Jul. 19, 2011

(65) Prior Publication Data

US 2013/0022136 A1 Jan. 24, 2013

(51) Int. Cl.
*H04L 27/00* (2006.01)

(52) U.S. Cl.
USPC .............................................. 375/259; 326/8

(58) Field of Classification Search
None
See application file for complete search history.

(56) References Cited

U.S. PATENT DOCUMENTS

| | | | |
|---|---|---|---|
| 7,423,451 B2 * | 9/2008 | Balasubramanian et al. | .. 326/38 |
| 7,492,313 B1 * | 2/2009 | Ehret et al. | ..................... 342/175 |
| 2004/0236873 A1 | 11/2004 | Kasame et al. | |
| 2007/0089082 A1 | 4/2007 | Liu et al. | |
| 2008/0258760 A1 | 10/2008 | Sullam et al. | |

OTHER PUBLICATIONS

Dedic, Ian, Fujitsu 56 Gs/s ADC Enabling 100 GbE, Fujitsu Microelectronics Europe GmbH, UK, OFC2010/OTHT6, pp. 1-28, Mar. 21-25, 2010.

Fujitsu, Reality Check: Challenges of mixed-signal VLSI design for high-speed optical communications, ECOC2009, Fujitsu Microelectronics Europe, Sep. 20-24, 2009, pp. 1-19.

Intersil ISLA112P50, 2-bit, 500 MSPS A/D Converter, FN7604.1, Jun. 17, 2010, pp. 1-35, www.intersil.com/products.

Krall, Christoph, et al., Time-Interleaved Digital-to-Analog Converters for UWB Signal Generation, Ultra-Wideband, 2007, ICUWB 2007, IEEE International Conference, Sep. 24-26, 2007, pp. 366-371.

Looney, Mark, "Advanced Digital Post Processing Techniques Enhance Performance in Time-Interleaved ADC Systems", Analog dialogue 37-8, Aug. 2003, pp. 1-5, http://www.analog.com/analogdialogue.

McCormack, Paul, "Solutions for time interleaving ultra-high-speed analog/digital converters at the PCB level", National Semiconductor Corp., Planet Analog, Nov. 9, 2009, 4 pages, Http://www.planetanalog.com/features/showArticle.jhtml?articleID=221600316.

National Semiconductor, ADC12D1x00 12-bit ADC family, Ultra High-Speed 12-bit ADCs up to 3.6 GSPS, pp. 1-2, national .com/gigadc, Product Brief 800714-001.

Poulton, Ken et al., "A 20GS/s8b ADC with a 1MB Memory in 0.18um CMOS", IEEE International Conference on Solid State Circuits (ISSCC 2003), Session 18, Nyquist A/D Converters, paper 18.1, Feb. 9-13, 2003, 10 pages, San Francisco, CA USA.

Velazquez, S. "High-performance advanced filter bank analog-to-digital converter for universal RF receivers", Proceedings of the IEEE SP International Symposium on Time-Frequency and Time-Scale Analysis, Oct. 6-9, 1998, pp. 229-232, Revere Beach, MA USA.

(Continued)

*Primary Examiner* — Crystal L Hammond
(74) *Attorney, Agent, or Firm* — John J. King

(57) ABSTRACT

An integrated circuit enabling the communication of data is described. The integrated circuit comprises an input/output port; a plurality of data converter circuits; and programmable interconnect circuits coupled between the input/output port and the plurality of data converter circuits, the programmable interconnect circuits enabling a connection of the plurality of data converter circuits to the input/output port of the integrated circuit. A method of enabling the communication of data in an integrated circuit is also described.

19 Claims, 12 Drawing Sheets

(56) References Cited

OTHER PUBLICATIONS

Xilinx, Inc., Application Note XAPP155, Virtex Analog to Digital Converter, Sep. 23, 2999, pp. 1-8, Version 1.1, Xilinx, Inc., San Jose, CA, USA.

Xilinx, Inc., Application Note XAPP355, Serial ADC Interface using a CoolRunner CPLD, Jan. 3, 2002, pp. 1-27, Version 1.1, Xilinx, Inc., San Jose, CA, USA.

Xilinx, Inc., Application Note XAPP866, An Interface for Texas Instruments Analog-to-Digital Converters with Serial LVDS Outputs, Apr. 7, 2008, pp. 1-30, Version 3.0, Xilinx, Inc., San Jose, CA, USA.

Xilinx, Inc., Data Sheet DS620, XPS Sysmon ADC (v3.00a), Mar. 1, 2011, pp. 1-27, Xilinx, Inc., San Jose, CA USA.

\* cited by examiner

US 8,548,071 B2

INTEGRATED CIRCUIT ENABLING THE COMMUNICATION OF DATA AND A METHOD OF COMMUNICATING DATA IN AN INTEGRATED CIRCUIT

FIELD OF THE INVENTION

An embodiment relates generally to integrated circuit devices, and in particular to a method of enabling the communication of data in an integrated circuit.

BACKGROUND

Data may be communicated in a system in different formats and according to a variety data communication protocols. For example, data may be transmitted as analog data. Analog data is a continuous signal having a time varying quality which is indicative of information being transmitted on the signal. In contrast, digital data is data that is sent as discrete components, where the values of the discrete components are indicative of information being transmitted. An analog signal uses a property of the medium through which it is transmitted to convey information. While an analog signal enables easy transmission of data, analog signals are often converted by an analog-to-digital converter to digital signals which are then processed by circuits of an integrated circuit. One common example of analog-to-digital conversion is the conversion of an analog audio signal to a digital representation which may be stored in a digital format.

However, depending upon the application, the requirements for the data conversion may vary. Some applications requiring digital signals generated from an analog input signal may require greater data rates than other applications. For example, a wireless data transmission may require the transmission of data at one data rate, represented in Mega samples per second (MSPS), for example. Another application, such as a medical imaging application, may require a higher data rate. Accordingly, for a given input signal, multiple analog-to-digital converters may be required. However, implementing analog-to-digital converters may lead to significant challenges.

SUMMARY OF THE INVENTION

An integrated circuit enabling the communication of data is described. The integrated circuit comprises an input/output port; a plurality of data converter circuits; and programmable interconnect circuits coupled between the input/output port and the plurality of data converter circuits, the programmable interconnect circuits enabling a connection of the plurality of data converter circuits to the input/output port of the integrated circuit.

The input/output port may further comprise a pair of input/output pins receiving a differential analog input signal. The integrated circuit may also comprise a clock generator coupled to the plurality of data converter circuits, wherein each data converter of the plurality of data converters receives a different clock signal. The plurality of data converter circuits may be on a first die of a multi-die integrated circuit separate from a second die having programmable resources of the multi-die integrated circuit. The integrated circuit may further comprise an interconnect circuit coupled to receive the first die and the second die, the interconnect circuit enabling the communication of data between the first die and the second die. The plurality of data converters circuits may comprise a plurality of digital-to-analog converter circuits. The integrated circuit may also comprise a summing circuit for generating an analog output signal based upon outputs of the plurality of digital-to-analog converter circuits.

According to an alternate embodiment, an integrated circuit enabling the communication of data comprises an input/output port; a plurality of analog-to-digital converter circuits; an analog-to-digital converter interface circuit coupled between the input/output port and inputs of the plurality of analog-to-digital converter circuits; and a clock generator enabling the plurality of analog-to-digital converter circuits to sample an analog input signal received at the input/output port.

According to the alternate embodiment, the analog-to-digital converter interface circuit may comprise programmable interconnect circuits, the programmable interconnect circuits enabling the connection of the plurality of analog-to-digital converter circuits to the input/output port of the integrated circuit. The clock generator may be coupled to receive a reference clock signal and generate a plurality of phase-shifted clock signals. The integrated circuit may comprise a multi-die integrated circuit and the plurality of analog-to-digital converter circuits may be on a first die of the multi-die integrated circuit separate from a second die having programmable resources of the multi-die integrated circuit. The integrated circuit may further comprise an interconnect circuit coupled to receive the first die and the second die, the interconnect circuit enabling the communication of data between the first die and the second die. The analog-to-digital converter interface circuit may enable routing an analog input signal received at the input/output port to each analog-to-digital converter circuit of the plurality of analog-to-digital converter circuits. The integrated circuit may further comprise a sampler coupled to receive an analog input signal, wherein a sample of the analog input signal is coupled to a selected analog-to-digital converter circuit by way of the analog-to-digital converter interface circuit.

A method of communicating data with an integrated circuit is also described. The method comprises implementing a plurality of analog-to-digital converter circuits in the integrated circuit; coupling an analog input signal to the integrated circuit; and sampling, by the plurality of analog-to-digital converter circuits, the analog input signal received at the input/output port.

The method may further comprises configuring programmable interconnect circuits coupled between the input/output port of the integrated circuit and the plurality of analog-to-digital converter circuits of the integrated circuit. The method may further comprise selecting the predetermined number of analog-to-digital circuits based upon a selected sample rate. Sampling, by the plurality of analog-to-digital converter circuits, an analog input signal received at the input/output port may comprise coupling the analog input signal to each analog-to-digital converter circuit of the plurality of analog-to-digital converter circuits. Alternatively, sampling, by the plurality of analog-to-digital converter circuits, an analog input signal received at the input/output port may comprise periodically coupling a sample of the analog input signal to an analog-to-digital converter circuit of the plurality of analog-to-digital converter circuits.

DETAILED DESCRIPTION OF THE DRAWINGS

Figure 1:
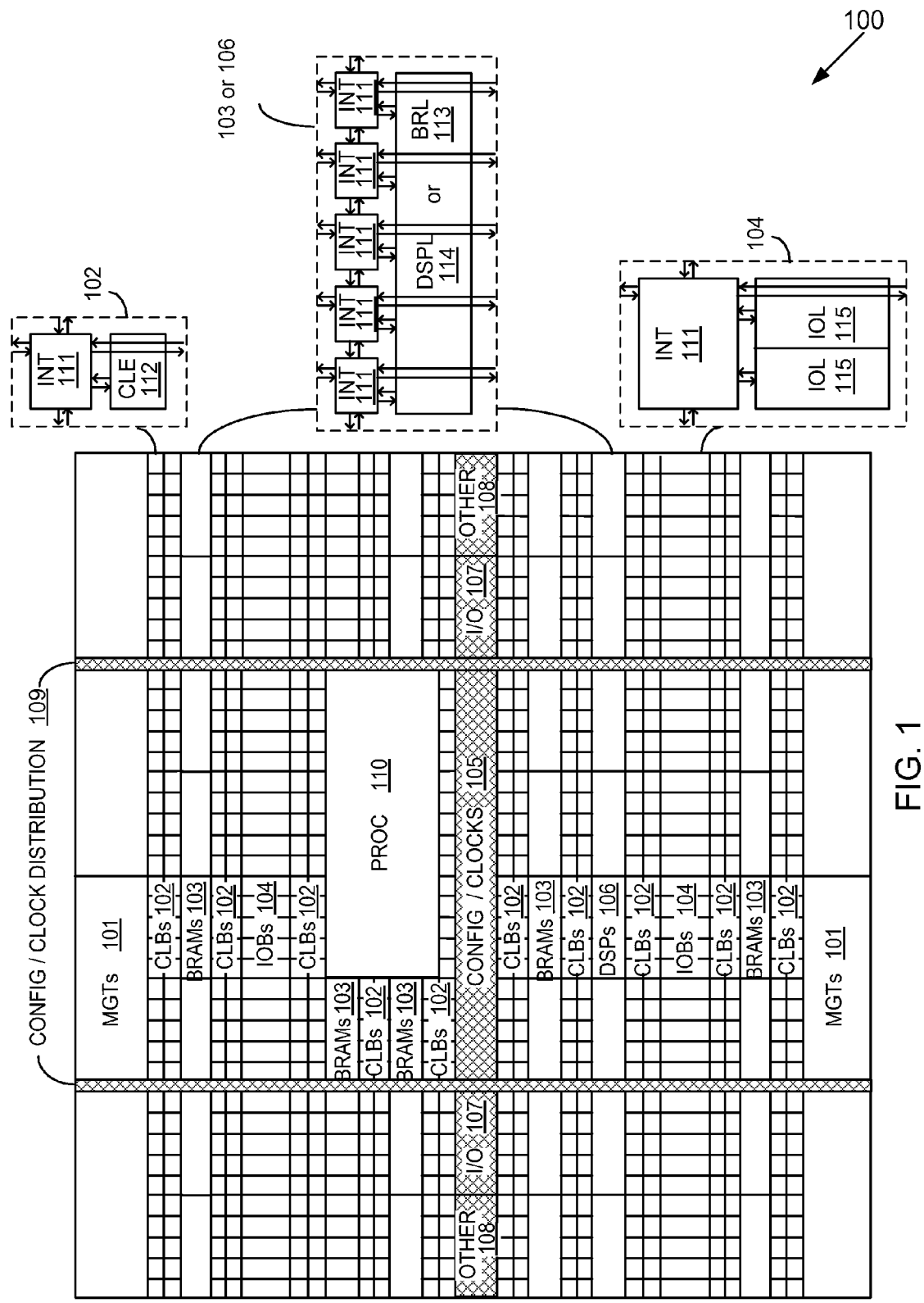
FIG. 1 is a block diagram of a programmable integrated circuit device having programmable resources according to an embodiment.

Turning first to FIG. 1, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear in order to facilitate the efficient implementation of user logic.

Figure 2:
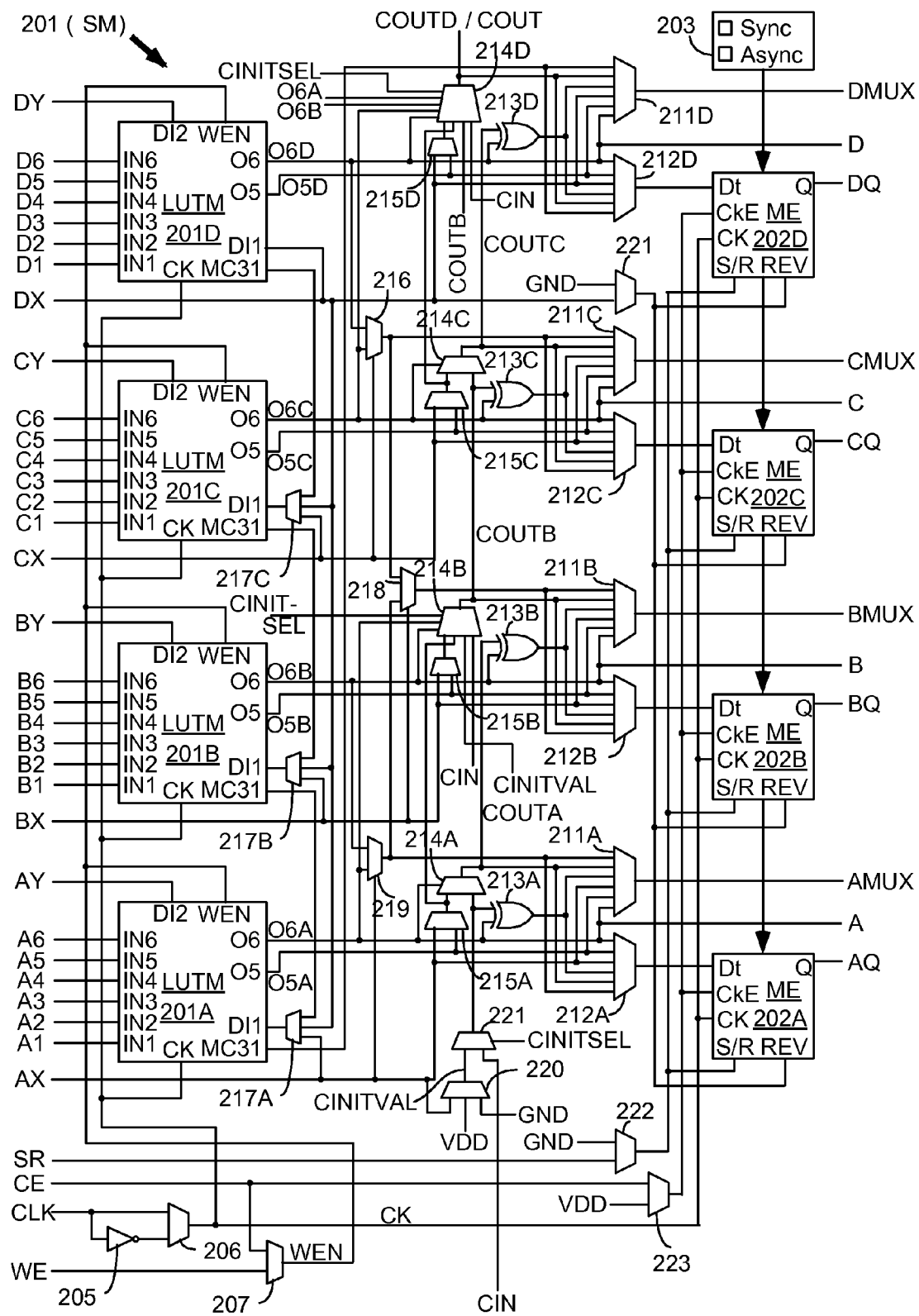
FIG. 2 is a block diagram of a configurable logic element according to an embodiment.

Turning now to FIG. 2, a block diagram of a configurable logic element according to an embodiment is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic having multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. Accordingly, the circuits and methods may be implemented in a device such as the FPGA of FIGS. 1 and 2, or any other suitable device.

Figure 3:
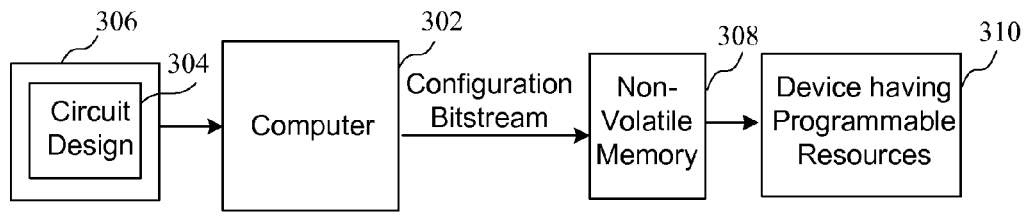
FIG. 3 is a block diagram of a system for programming a device having programmable resources according to an embodiment.

Turning now to FIG. 3, a block diagram of a system for programming a device having programmable resources according to an embodiment is shown. In particular, a computer 302 is coupled to receive a circuit design 304 from a memory 306, and generate a configuration bitstream which is stored in the non-volatile memory 308. As will be described in more detail below, the circuit design may be a high level design, such as a circuit design defined in a hardware description language (HDL). Also, the computer may be configured to run software that generates a configuration bitstream which is stored in the non-volatile memory 308 and then provided to a device 310 having programmable resources.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 302 may implement the portions of a circuit design implementing certain functions in configurable logic blocks (CLBs) or digital signal processing (DSP) blocks, for example. An example of a synthesis tool is the ISE® tool available from Xilinx®, Inc. of San Jose, Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen available from Xilinx®, Inc. of San Jose, Calif. The bitstream may also be encrypted according to a predetermined encryption standard. The bitstream is either downloaded by way of a cable or programmed into an EPROM for delivery to the programmable integrated circuit. If encoded, the bitstream is then decoded by the programmable integrated circuit according to the predetermined encryption standard.

Figure 4:
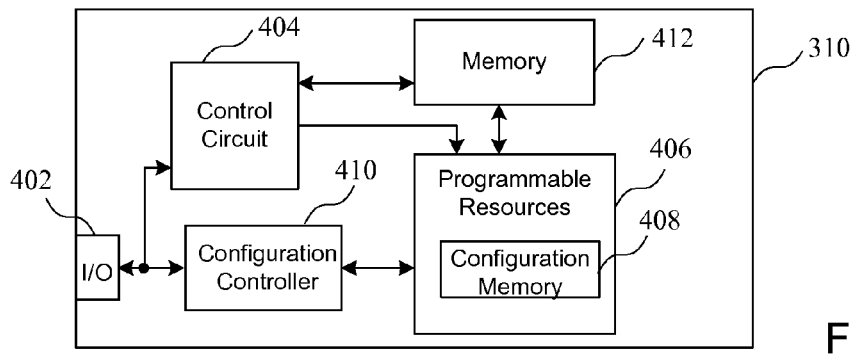
FIG. 4 is a block diagram of an integrated circuit having elements for configuring programmable resources according to an embodiment.

Turning now to FIG. 4, a block diagram of an integrated circuit having elements for configuring programmable resources according to an embodiment is shown. The circuit of FIG. 4 is implemented in an integrated circuit having an input/output (I/O) port 402 coupled to a control circuit 404 and programmable resources 406. The programmable resources 406 include circuit elements which are configurable by a user of the circuit to implement a circuit design of the user's choice. The programmable resources 406 may include programmable logic, such as the programmable logic described in reference to FIGS. 1 and 2.

The circuits implemented in the programmable resources 406 may be implemented according to configuration bitstream downloaded to the integrated circuit 400. As will be described in more detail below, the programmable resources 406 include configuration memory 408. Generally, configuration memory 408 includes memory cells for configuring the programmable resources 406 based upon configuration bits of the configuration bitstream. Although a single block of programmable resources 406 and configuration memory 408 is shown, a given integrated circuit may include a plurality of blocks having programmable resources controlled by configuration memory. Also, the integrated circuit 400 may include a memory 412, such as a non-volatile memory external to the programmable resources 406, for storing configuration data.

A configuration controller 410 may be implemented, as a part of or separate from the control circuit 404, to load the configuration data into the configuration memory 408. The configuration data may be loaded directly by the configuration controller 410 by way of the I/O port 402, or by way of the control circuit 404 and the memory 412. The circuit of FIG. 4 may be any device having programmable resources 406, such as a programmable logic device as described below, or an application-specific integrated circuit (ASIC) having a portion of circuits which is programmable or memory for storing sensitive data. The circuit of FIG. 4 could be the device 310 having programmable resources, for example.

Figure 5:
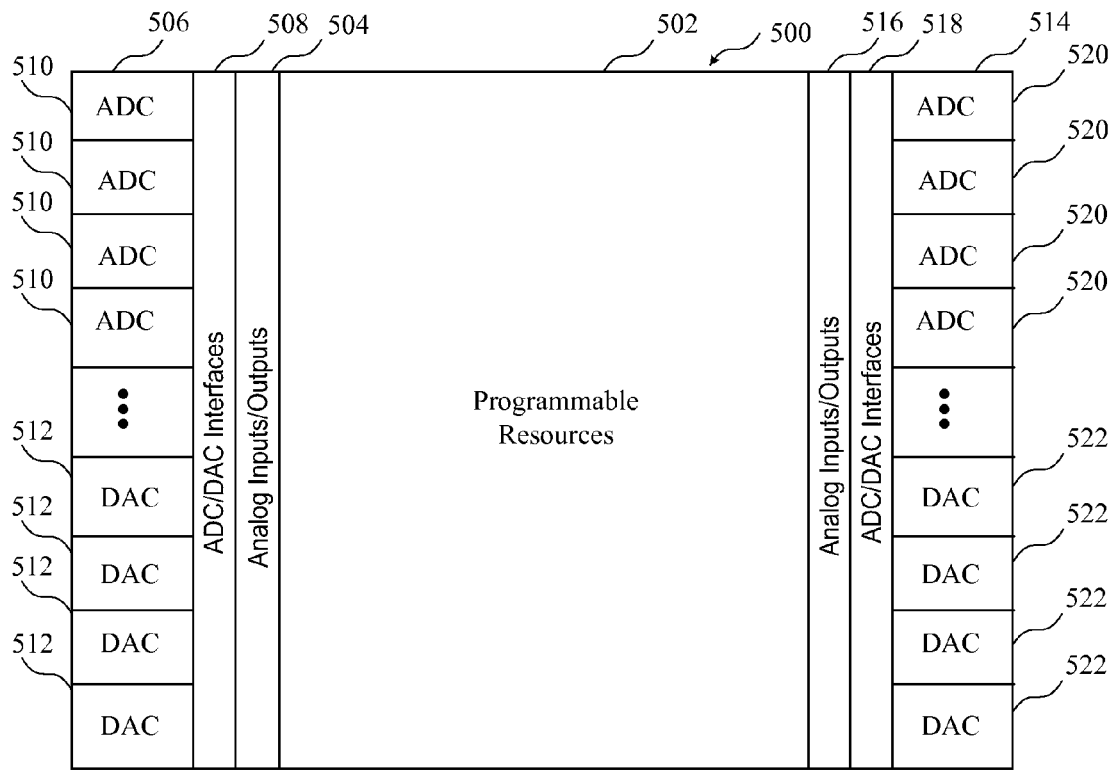
FIG. 5 is a block diagram of an integrated circuit enabling the communication of data according to an embodiment.
Figure 14:
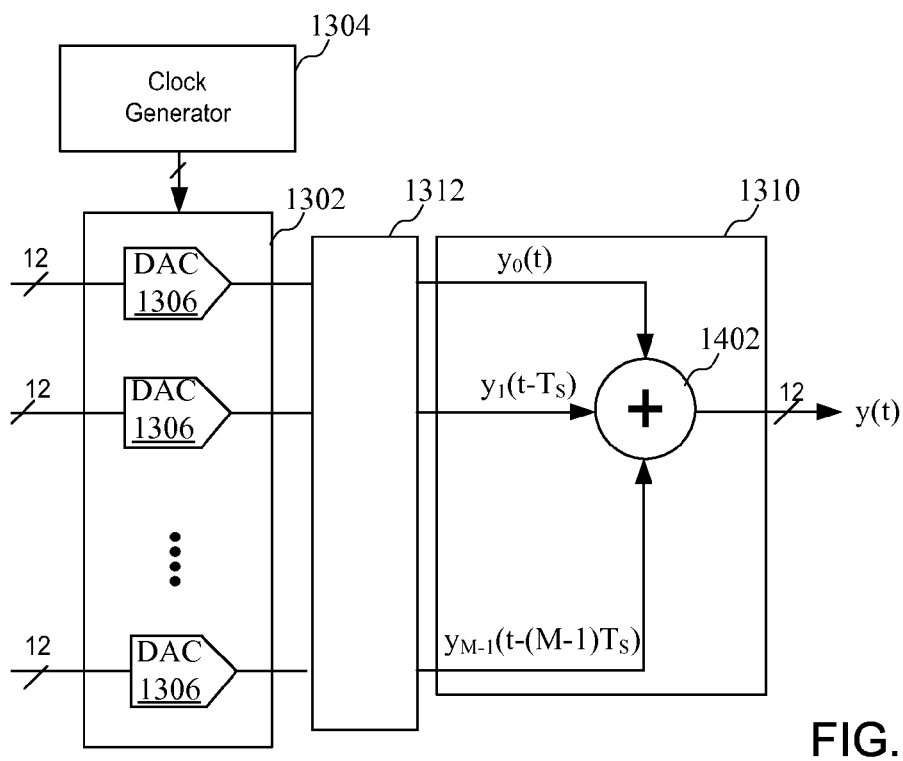
FIG. 14 is a block diagram of integrated circuit enabling the communication of data from the integrated circuit having a configuration according to an embodiment.

Turning now to FIG. 5, a block diagram of an integrated circuit 500 enabling the communication of data according to an embodiment is shown. The integrated circuit 500 comprises programmable resources 502 and a column of analog inputs and outputs 504 which enables access to analog-to-digital converter (ADC) circuits 510 and digital-to-analog converter (DAC) circuits 512 by way of ADC/DAC interfaces 508. A second column of analog inputs and outputs 516 enables access to a column 514 of ADC circuits 520 and DAC circuits 522 by way of ADC/DAC interfaces 518. As will be described in more detail below, the elements of FIG. 5 could be provided on a single die, or multiple die of a single integrated circuit as shown in FIG. 14.

The various embodiments which integrate ADCs on an integrated circuit provide significant advantages to conventional implementations which employ ADCs separate from an integrated circuit which processes the outputs of the ADCs. For example, in a high channel count application like medical imaging, each of sixteen available ADCs can be used by a separate input, or a number these ADCs can be combined by employing interleaving, where a given channel uses multiple data converters. For example, multiple data converters may be used with each of two channels to implement a two-channel, high-sample rate solution for wireless applications. By employing time interleaving of ADCs, a lower power solution compared to monolithic solutions may be implemented. Also, the over-all power can be reduced compared to a solution having discrete ADCs separate from the integrated circuit by eliminating the need to provide an external interface between the discrete ADC circuits and the integrated circuit.

The various embodiments may also reduce the cost of implementing the ADC and DAC circuits. An ADC circuit converts an analog input, such as voltage or current, to a digital number which is proportional to the magnitude of the analog input signal. The resolution of an ADC circuit indicates the number of discrete values it can produce over a range on input values. For example, a twelve bit ADC circuit can encode an analog input to one of $2^{12}$ or 4096 levels. While a twelve bit ADC circuit is described in the various embodiments by way of example, the resolution of the converter circuits may be selected based upon the cost of implementing the converter circuits and the needs for processing data.

Moderate speed ADC circuits, such as 12 bit ADC circuits, can be implemented on advanced CMOS processes that consume very small amounts of die area. Large numbers of ADCs, such as 16 or more ADCs, can be implemented and combined/interleaved in a smaller die area than a single high specification ADC instantiation. Implementing the data converters on the integrated circuit may also reduce the complexity of the printed circuit board which receives the integrated circuit. Further, the various embodiments enable digitally assisted techniques to be applied to produce 'analog' performance that does not rely on the 'analog' parameters of an advanced CMOS process. Integration of a large number of moderate performance data converters with programmable resources of an FPGA enables delivering a low cost, low power, and flexible analog front end using time domain interleaving. The various embodiments may be implemented to enable medical imaging, wireless communications, Aerospace and Defense (A&D), and various Industrial, Scientific and Medical (ISM) applications such as power conversion & motor control.

Figure 6:
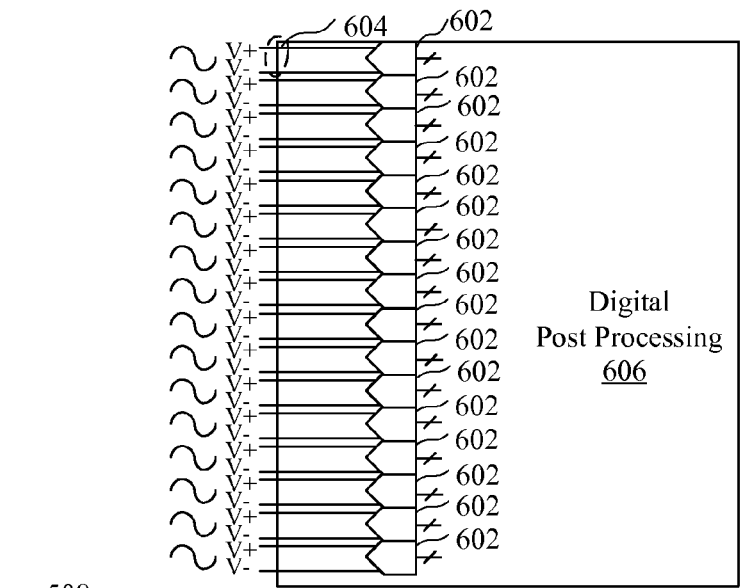
FIG. 6 is a block diagram of an integrated circuit having a plurality of analog-to-digital converter circuits according to an embodiment.
Figure 7:
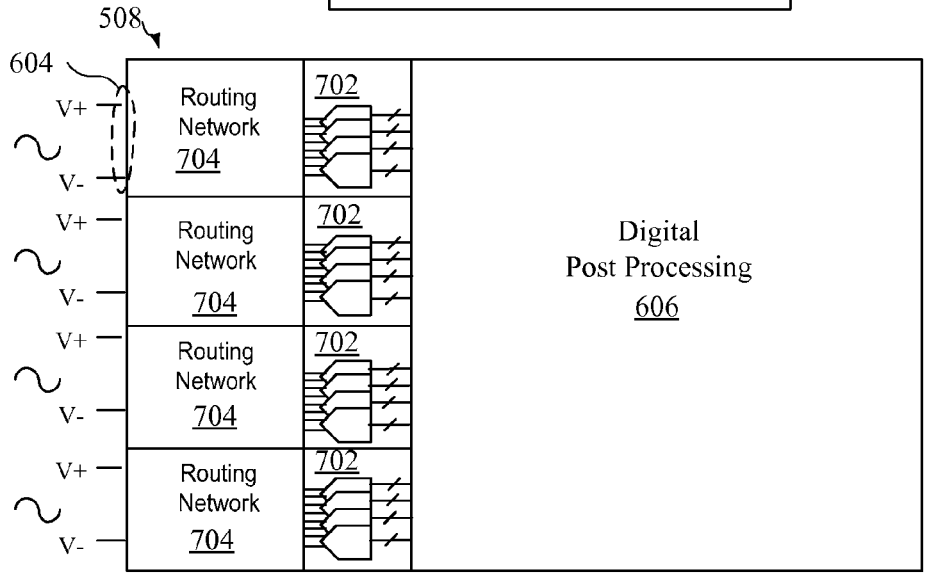
FIG. 7 is a block diagram of an integrated circuit having a plurality of analog-to-digital converter circuits associated with an input/output port according to an embodiment.
Figure 8:
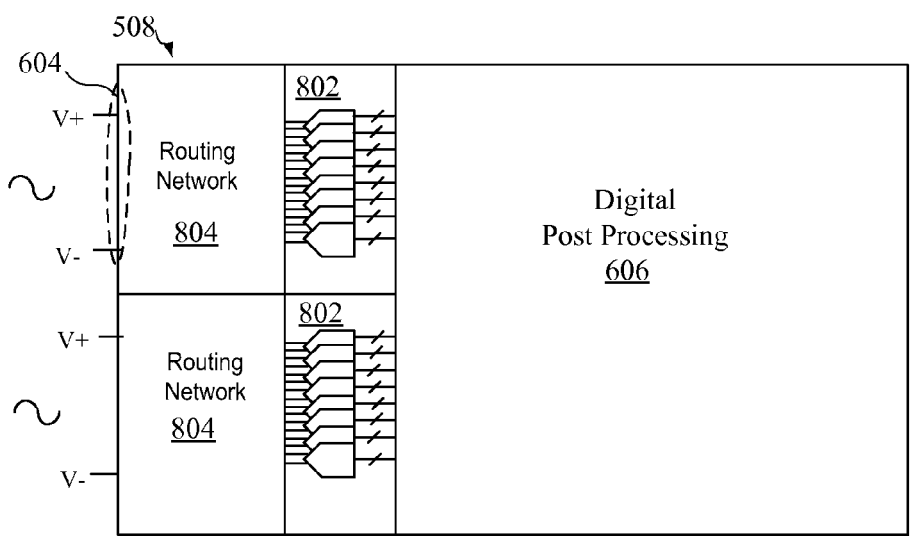
FIG. 8 is a block diagram of an integrated circuit having a plurality of analog-to-digital converter circuits associated with an input/output port according to an alternate embodiment.

Turning now to FIGS. 6-8, block diagrams of an integrated circuit having a plurality of analog-to-digital converter circuits according to various embodiments are shown. As shown in the embodiment of FIG. 6, sixteen ADC circuits 602 are provided, where each ADC circuit is coupled to a separate input/output port 604 and to digital post processing circuits 606. The embodiment of FIG. 6 may be implemented with an application where the performance of the ADC converter is sufficient to process the data input to a large number of input/output ports. However, for an application requiring higher sampling rates, it may be necessary to interleave a plurality of ADC circuits. Time interleaving of the plurality of ADC circuits is implemented by sampling input data at different times for each ADC circuit, and routing portions of the input data to different ADC circuits. The time interleaving of ADC circuits enables multiplying the sample rate of existing ADC circuits. That is, rather than implementing a higher sample rate ADC circuit, multiple ADC circuits can be time multiplexed to enable the same sampling rate as a single ADC circuit having higher performance.

While reference is made to input/output ports, it should be understood that an input/output port may be a dedicated input port, such as when receiving analog input signals, or a dedicated output port, such as when generating analog output signals. That is, while an input/output port may function for both receiving and transmitting signals, a given input/output port may be implemented as either an input port or an output port depending upon the use of that input/output port. Alternatively, a port designated as an input/output port may be implemented to function only as an input port or an output port.

According to the embodiment of FIG. 7, a block 702 of ADC circuits, shown here by way of example with 4 ADC circuits, is implemented. The four ADC circuits are coupled to a routing network 704. As will be described in more detail below in reference to FIG. 9, the routing network 704 enables different sampling rates when converting an analog input signal to the input/output port 604 to be processed by the digital post processing circuit 606. That is, moderate speed ADC circuits, such as ADC circuits operating at 50 Msps, when implemented in a system enabling time interleaving, allow a greater sampling rate for data associated with a single I/O port. According to the embodiment of FIG. 7, only 4 differential input channels could be implemented compared to the sixteen differential input channels of FIG. 6. As shown in the embodiment of FIG. 8, a block 802 of ADC converters comprises 8 ADC converters. According to the embodiment of FIG. 8, only 2 differential input channels could be implemented, but each channel would have a greater sampling rate of the analog input signal.

Figure 9:
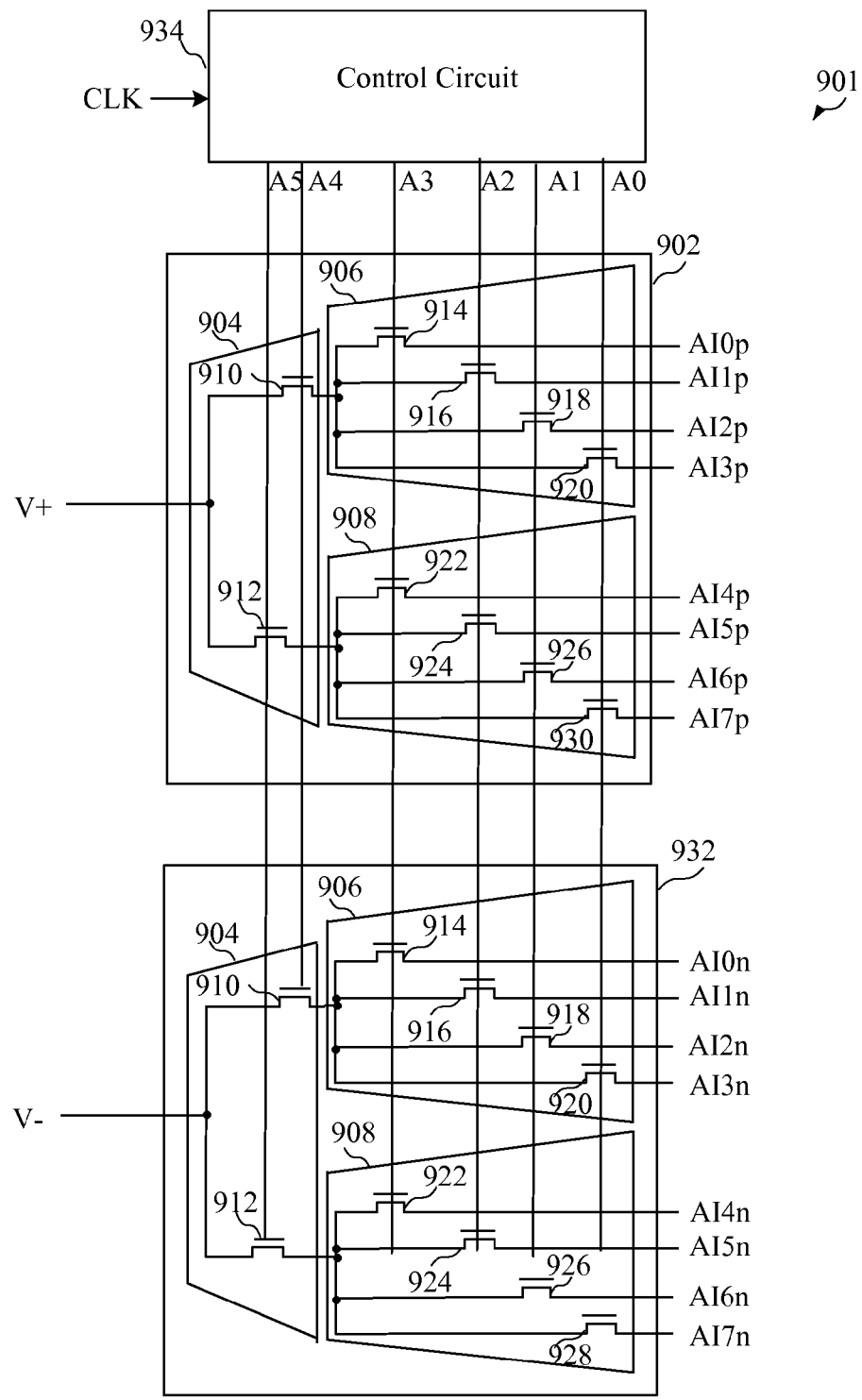
FIG. 9 is a block diagram of a programmable interconnect circuit according to an embodiment.

Turning now to FIG. 9, a block diagram of a programmable interconnect circuit according to an embodiment is shown. The programmable interconnect circuit could be implemented as an ADC interface, or more particularly, the routing network 704 or 804. Programmable interconnect circuit 901 receives an input V+ at a routing circuit 902. The routing circuit comprises stages of routers including a router 904 in a first stage and routers 906 and 908 in a second stage which enable the generation of the analog input signal at the appropriate multiplexer outputs AI0p-AI7p. The router 904 comprises a first transistor 910 enabling routing the input signal V+ to the router 906 and a second transistor 912 enabling routing the input signal V+ to the router 908. The router 906 comprises a transistor 914 for generating the output AI0p, a transistor 916 for generating the output AI1p, a transistor 918 for generating the output AI2p, and a transistor 920 for generating the output AI3p. Similarly, the router 908 comprises a transistor 922 for generating the output AI4p, a transistor 924 for generating the output AI5p, a transistor 926 for generating the output AI6p, and a transistor 928 for generating the output AI7p. A second routing circuit 932 is the same as the routing circuit 902 except that it is coupled to receive an input V− and couples the analog input signal at the appropriate router outputs AI0n-AI7n. When implementing a differential input, both routing circuit 902 and routing circuit 932 are used to receive the positive input V+ and negative input V−.

A control circuit 934 is coupled to the routing circuit 902 and the routing circuit 932. As will be described in more detail below, the control circuit will generate the appropriate control signals for A0-A5 to couple the input signal to the appropriate one or more ADC circuits.

When implementing the embodiment of FIG. 7, for example, the routing circuits would route the inputs V+ and V− to four ADC circuits as shown in the block 702. That is, only the outputs AI0p-AI3p and AI0n-AI3n are required. In contrast, when implementing the embodiment of FIG. 8, the routing circuits would route the inputs V+ and V− to the eight ADC circuits as shown in the block 802, where all of the outputs AI0p-AI7p and AI0n-AI7n are required. Accordingly, the analog input signal, shown here as differential data V+ and V−, is selectively routed to ADC circuits in response to the control signals D5-D0. While the routing network of FIG. 9 is shown by way of example, it should be understood that other configurations of programmable interconnect circuits could be employed. It should further be apparent that the configuration of a programmable interconnect circuit may be different for enabling the communication of data within a circuit block.

Figure 10:
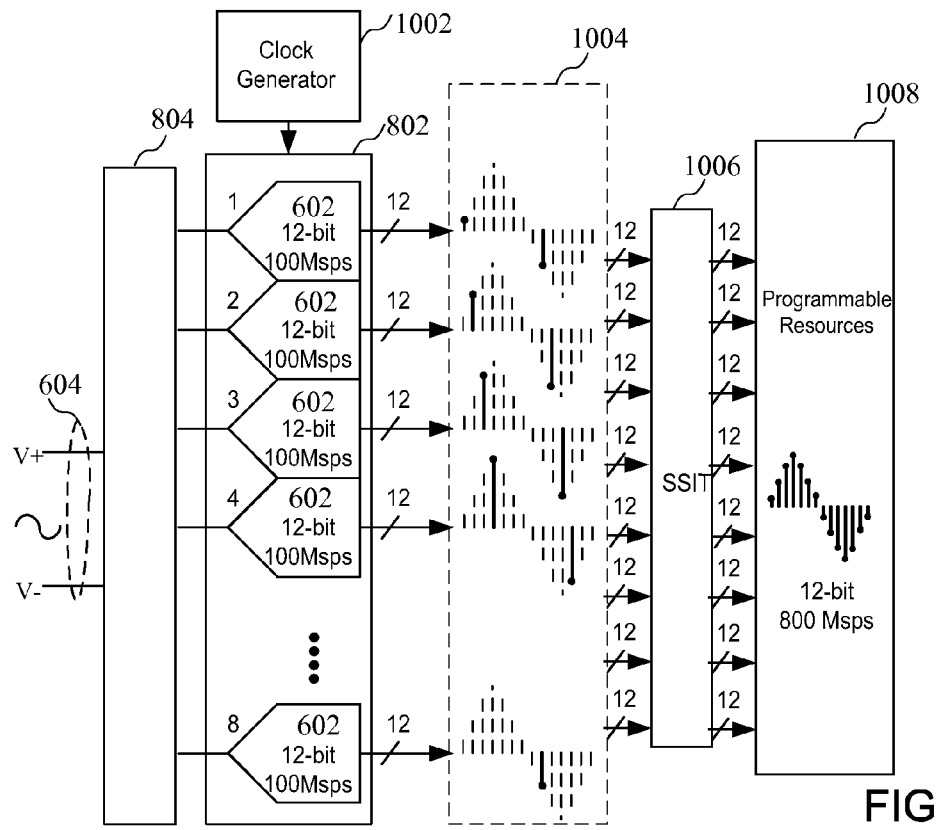
FIG. 10 is a block diagram of an integrated circuit enabling the communication of data to the integrated circuit according to an embodiment.

Turning now to FIG. 10, a block diagram of an integrated circuit enabling the communication of data according to an embodiment is shown. The block diagram of FIG. 10 shows a more detailed example of the embodiment of FIG. 8, where 8 ADC circuits 602 are coupled to a single input/output port 604. That is, the routing network 804 enables the coupling of the analog input signal at input/output port 604 to each of 8 ADC circuits 602 of the block 802. A clock generator 1002 generates a plurality of clock signals which enable the analog input signal which is coupled to the input/output port 604 to be sampled at different times, and therefore increase the sampling rate of the signal. As will be described in more detail below, the sampling rate of the analog input signal can be increased 8 times to generate 800 Msps using only 100 Msps ADC circuits. The clock generator 1002 could comprise a multiphase clock circuit which receives an input clock signal CLK and generates 7 phase shifted clock signals for a total of 8 clock signals having different phases. The phase shifted clock signals could be, for example, 45°, 90°, 135°, 180°, 225°, 270°, and 315° phases of the CLK signal. When only 4 phase shifted clock signals are required, such as in the example of FIG. 7, the CLK (or 0° phase) and the 90°, 180° and 270° phases could be used. As will be described in more detail below in reference to FIG. 16, the ADCs 602 will sample the input signal at the appropriate time.

As shown in the dashed box 1004, the portions of the sampled analog input signals are shown corresponding to digital data output by one of eight ADCs 602. As can be seen in the dashed box 1004, the output of the first ADC 602 corresponds to the first and ninth sample of the analog input signal, the output of the second ADC 602 corresponds to the second and tenth sample of the analog input signal, etc. The outputs of the ADC circuits 602 are provided to an interface circuit 1006. As will be described in more detail in reference to FIGS. 12 and 17, the interface circuit 1006 enables the routing of the output signals from the ADCs 602 to programmable resources 1008, such as programmable resources of an FPGA, for example. Because the programmable resources 1008 may only be able to process data at 100 Msps, for example, the programmable resources would process the data using the 96-bit digital data at 100 Msps output by the ADC circuits. While the routing network 804 may be implemented as a part of the integrated circuit, such as in the ADC/DAC interface 504 for example, the functionality of the routing network may also be implemented separate from the integrated circuit as a part of a printed circuit board which receives the integrated circuit, for example. That is, an analog input signal could be routed by connections of a printed circuit board to the inputs of each of the plurality of ADC circuits, where the ADC circuits will sample the analog input signal as described above.

Figure 11:
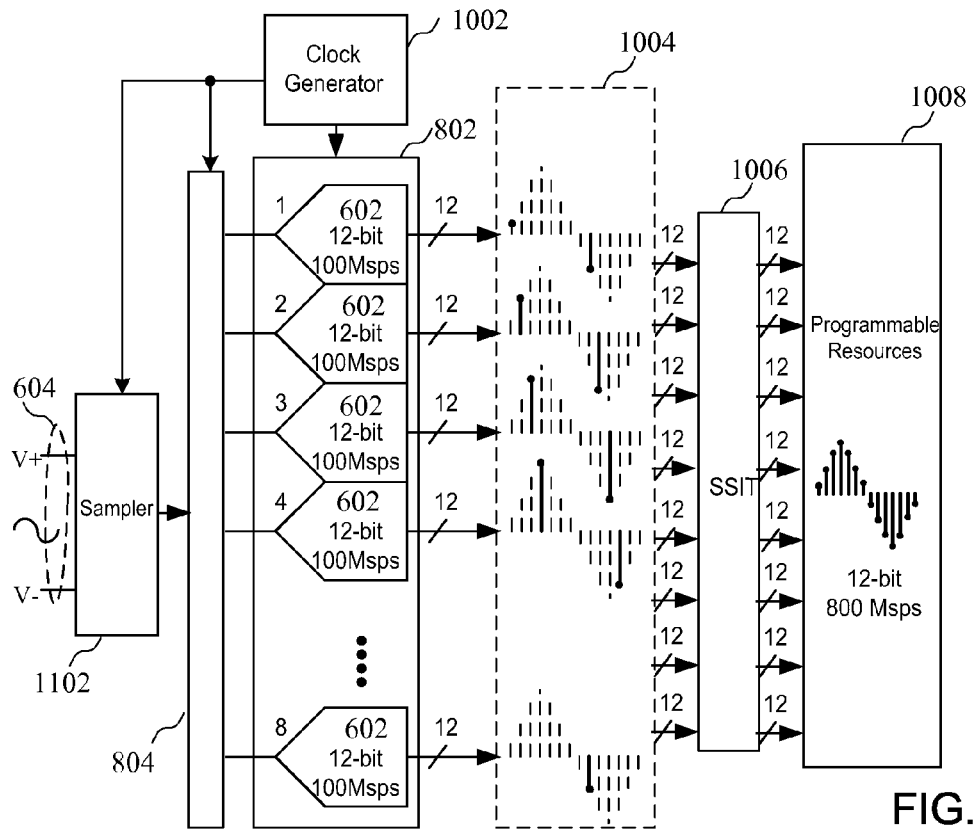
FIG. 11 is a block diagram of an integrated circuit enabling the communication of data to the integrated circuit according to an alternate embodiment.

Turning now to FIG. 11, a block diagram of an integrated circuit enabling the communication of data to the integrated circuit according to an alternate embodiment is shown. According to the embodiment of FIG. 11, a sampler 1102 is provided. Rather than having the ADC circuits perform the sampling as described above in reference to FIG. 10, the sampler 1102 comprises a fast sampler which, along with the routing network 804, will provide a portion of the analog signal to the appropriate ADC converter 602. Accordingly, rather than route the analog input signal to each of the ADC circuits 602 of a group of ADC circuits which are to receive the analog input signal and enable the sampling by the ADC circuits, the sampler 1102 and the routing network 804 enable to routing of a sample of the analog input signal to a selected ADC circuit 606. That is, the clock generator will periodically sample the analog input signal, while the routing network 804 will periodically change the routing of the sampled signal to a different ADC circuit. For example, the control circuit 934, in response to a high speed clock signal generated by the clock generator, will route the input signal to a single ADC circuit 602, where the ADC circuit receiving the sample of the analog input signal will periodically change. It should be understood that the sampler 1102 and the routing network 804 may each be a part of the integrated circuit. Alternatively, either the sampler 1102 or both the sampler 1102 and the routing network 804 may be separate from the integrated circuit implementing the ADC circuits 602 and programmable resources 1008.

Figure 12:
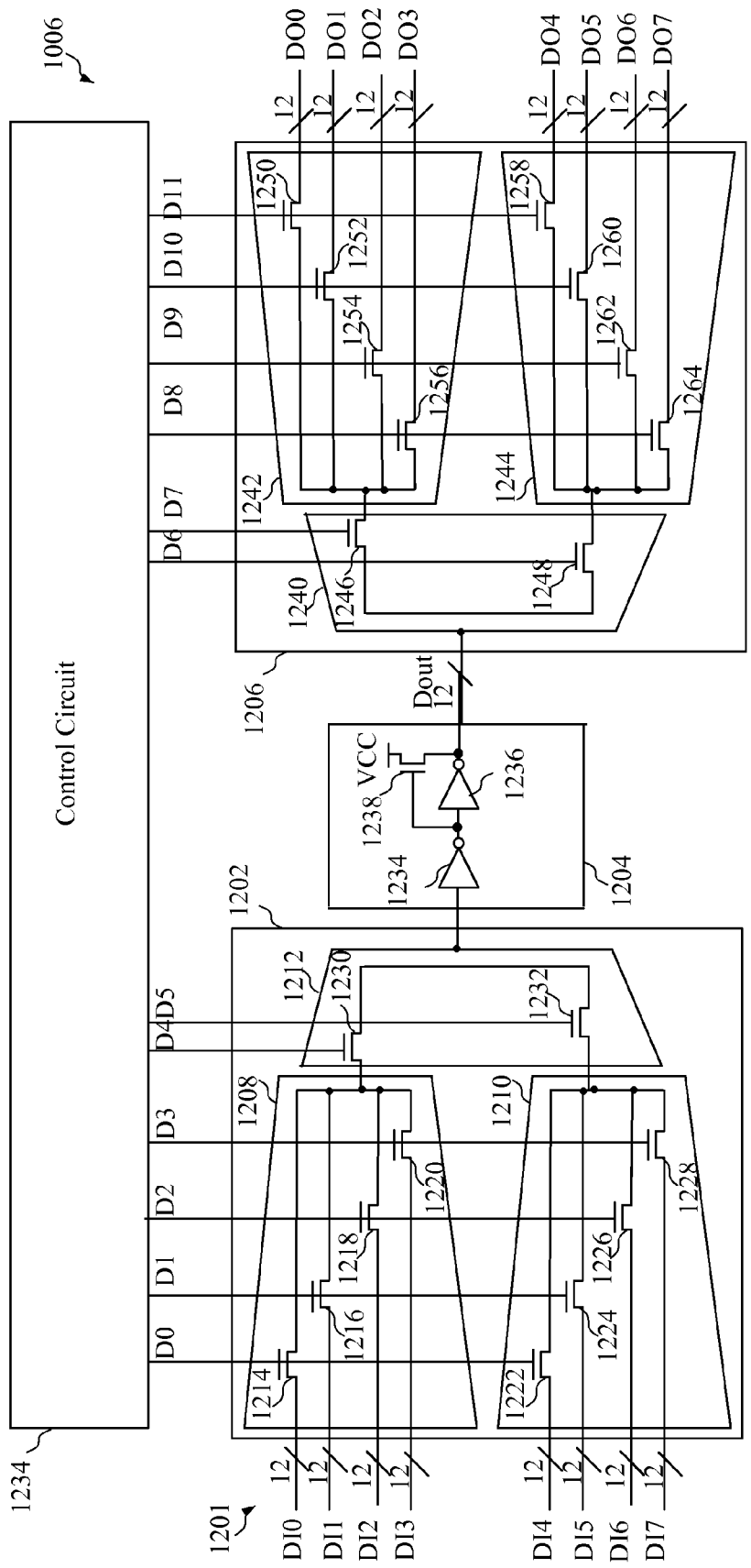
FIG. 12 is a block diagram of an interface circuit according to an embodiment.

Turning now to FIG. 12, a block diagram of the interface circuit 1006 according to an embodiment is shown. The interface circuit comprises a routing matrix which is programmable to enable the coupling of various inputs, designated by DIx, to various outputs, designated by DOx. According to one embodiment, the input signals DIx could be outputs of the ADCs 602, and the outputs DOx could be inputs to programmable resources of an FPGA, for example. In particular, the interface circuit 1006 may comprise a multiplexer circuit 1202, a buffer circuit 1204, and demultiplexer 1206.

The multiplexing circuit 1202 comprises stages of multiplexers including multiplexers 1208 and 1210 in a first stage and a multiplexer 1212 in a second stage. The multiplexer circuit 1202 as shown receives 8 digital input signals DI0-DI7 which may be selected to be coupled to output buffer 1204. The multiplexer 1208 comprises a transistor 1214 for receiving the input DI0, a transistor 1216 for receiving the input DI1, a transistor 1218 for receiving the input DI2, and a transistor 1220 for receiving the input DI3. Similarly, the multiplexer 1210 comprises a transistor 1222 for receiving the input DI4, a transistor 1224 for receiving the input DI5, a transistor 1226 for receiving the input DI6, and a transistor 1228 for receiving the input DI7. The multiplexer 1212 comprises a first transistor 1230 enabling routing the output of the multiplexer 1208 and a second transistor 1232 enabling routing the output of the multiplexer 1210.

The output buffer 1204 comprises and inverter 1234 and an inverter 1236. A transistor 1238 is coupled at its gate to the output of the inverter 1234 and its source to the output of the inverter 1236. The output buffer circuit 1204 receives a selected input to the multiplexing circuit 1202, and generates an output which is coupled to the demultiplexer circuit 1206.

The demultiplexer 1206 comprises stages of de-multiplexers including demultiplexer 1240 in a first stage and demultiplexers 1242 and 1244 in a second stage. The demultiplexer circuit 1240 receives the output of the buffer circuit 1204 at its input and generates an output using transistors 1246 and 1248. The multiplexer 1242 comprises a transistor 1250 for generating the output DO0, a transistor 1252 for generating the output DO1, a transistor 1254 for generating the output DO2, and a transistor 1258 for generating the output DO3. Similarly, the multiplexer 1244 comprises a transistor 1258 for generating the output DO4, a transistor 1260 for generating the output DO5, a transistor 1262 for generating the output DO6, and a transistor 1264 for generating the output DO7.

The control circuit 1334 also generates the appropriate control signals D0-D11 to couple the appropriate input data to the appropriate data outputs. The control circuit may comprise memory elements for storing configuration data. Accordingly, when configuring an integrated circuit, the ADCs may be configured as desired by a user, for example as shown in FIGS. 6-8 for example.

Figure 13:
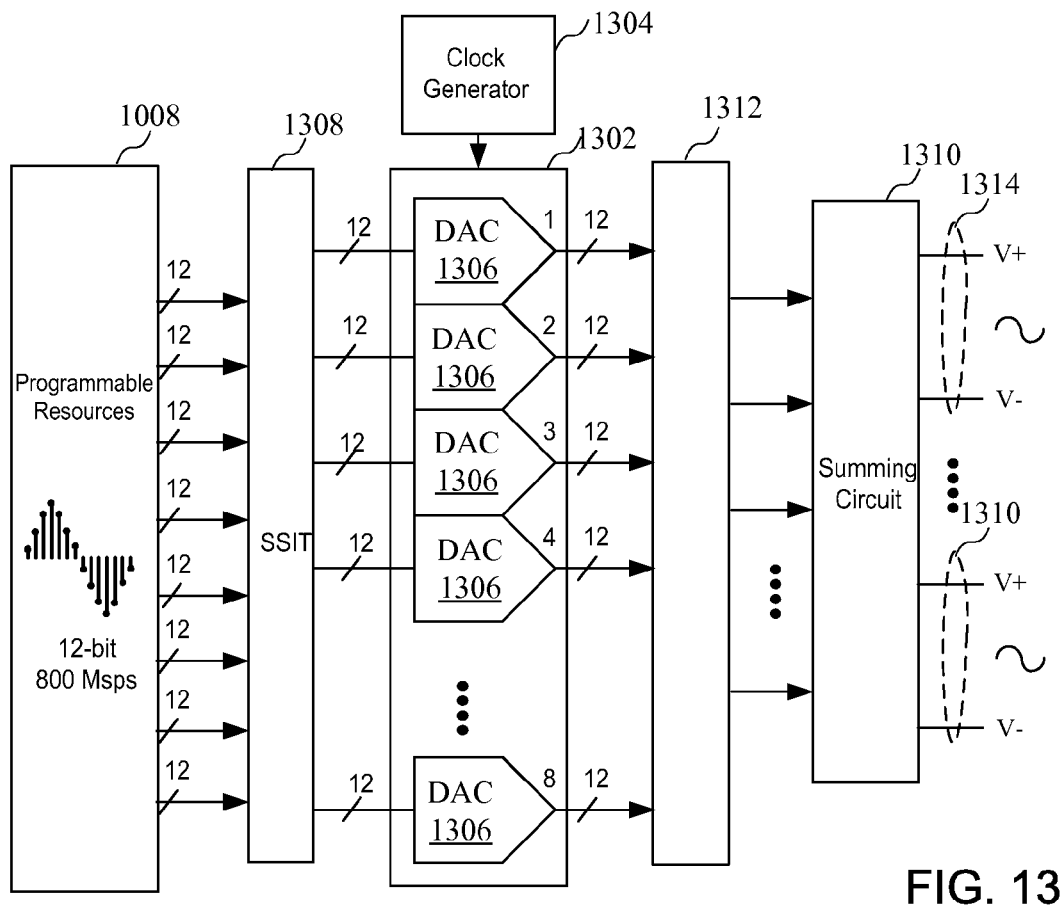
FIG. 13 is a block diagram of an integrated circuit enabling the communication of data from the integrated circuit according to an embodiment.
Figure 15:
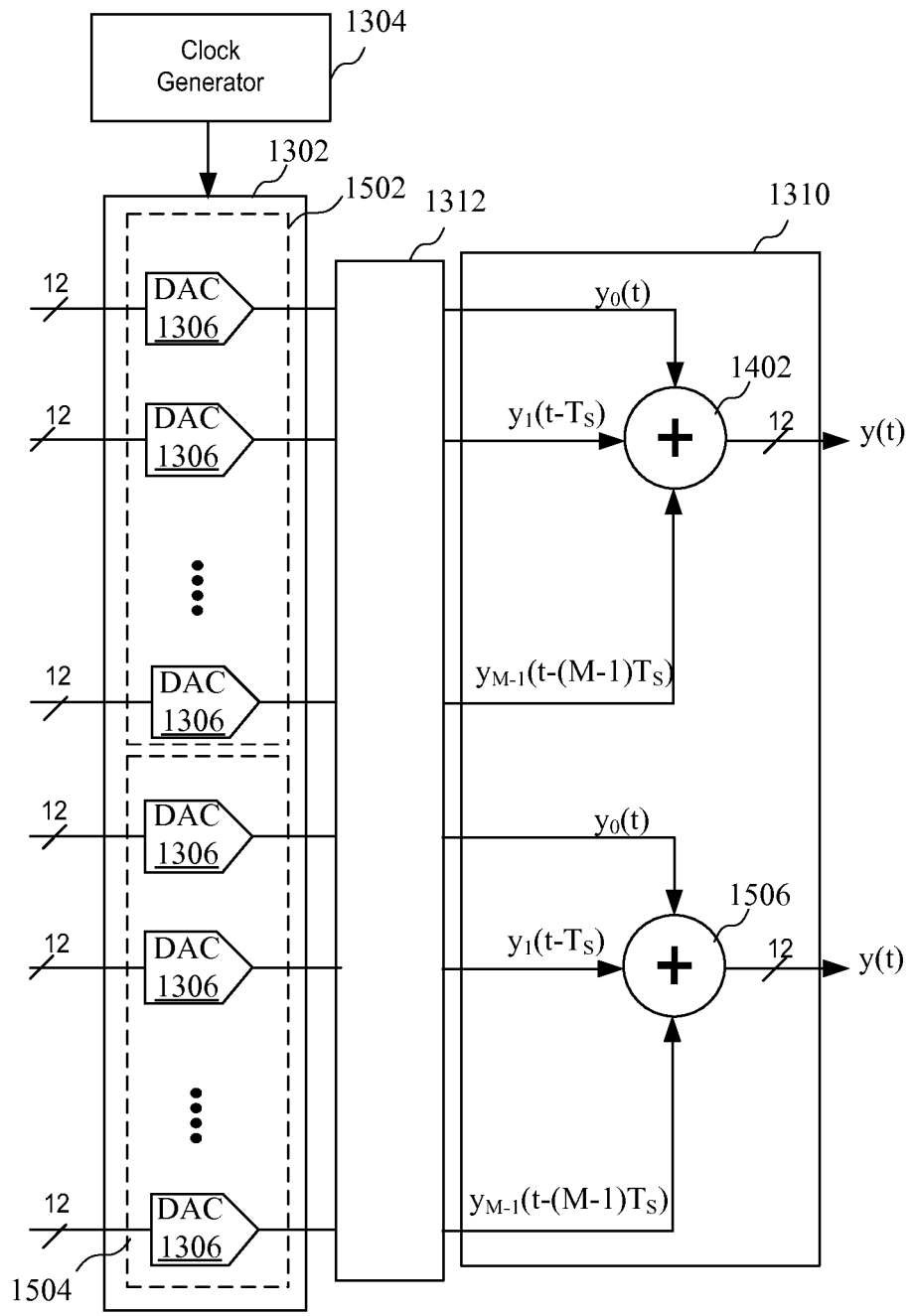
FIG. 15 is a block diagram of integrated circuit enabling the communication of data from the integrated circuit having a configuration according to an alternate embodiment.

Turning now to FIG. 13, a block diagram of an integrated circuit enabling the communication of data from the integrated circuit according to an embodiment is shown. Similar to the embodiments of FIGS. 5-11 which describe the implementation of plurality of ADC circuits on an integrated circuit, FIGS. 13-15 describe the implementation of plurality of DAC circuits on an integrated circuit. In particular, a block 1302 coupled to a clock generator 1304 comprises a plurality of DAC circuits 1306. The DAC circuits 1306 are coupled to receive inputs from programmable resources 1008 or other circuits of the integrated circuit by way of a programmable interface circuit 1308. As will be described in more detail below, the interface circuit may be a programmable interface circuit enabling the routing of signal between different die of an integrated circuit. A summing circuit 1310 is also coupled to receive the outputs of the DAC circuits by way of a programmable interface circuit 1312 and generate one or more analog output signals 1314. Depending upon the implementation of the DAC circuits, the programmable interface circuit 1312 enables the summing of outputs of different DACs, as will be described in more detail in reference to FIGS. 14 and 15. The programmable interface circuits 1308 and 1312 may be implemented using an interface circuit such as that shown in FIG. 12, for example.

Turning now to FIG. 14, a block diagram of integrated circuit enabling the communication of data from the integrated circuit having a configuration according to an embodiment is shown. The summing circuit 1310 comprises a summer 1402 for receiving outputs of the DAC circuits 1306. The programmable interface circuit 1312 enables routing the outputs of the DACs to a selected summer circuit. According to the embodiment of FIG. 14, the outputs of all of the DACs 1306 are routed to the summer circuit 1402. According to the embodiment of FIG. 15, the block 1302 comprises a first group of DACs 1502 and a second group of DACs 1504, and the summing circuit 1310 comprises a second summer 1506. Outputs of the first group of DACs 1502 are routed to the summer 1402, while the outputs of the second group of DACs 1504 are routed to the summer 1506. That is, the programmable interface circuit 1312 is configured to route the outputs of the DACs to the appropriate summer. While all of the elements of FIGS. 13-15 could be on a single integrated circuit, the programmable interface circuit 1312 and the summing circuit 1310 could be separate from the integrated circuit having the DACs, such as on a printed circuit board, for example.

Figure 16:
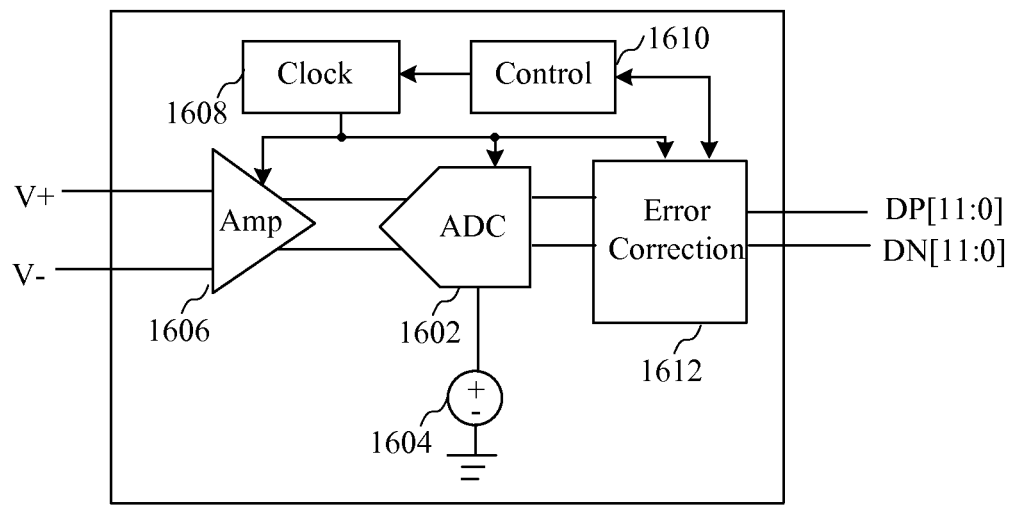
FIG. 16 is a block diagram of an analog-to-digital circuit according to an embodiment.

Turning now to FIG. 16, a block diagram of an ADC circuit is shown. The ADC circuit comprises an analog-to-digital circuit 1602 coupled to a reference voltage generator 1604. The analog-to-digital circuit 1602 is also coupled to receive an output of an amplifier 1606 which receives the differential input V+ and V−. A clock circuit 1608 and a control circuit 1610 are coupled to control the analog-to-digital converter 1602 and the amplifier 1606. The clock circuit 1608 and the control circuit 1610 enable sampling of the analog input signal according to the embodiment of FIG. 10. The output of the analog-to-digital converter 1602 is provided to an error correction circuit 1612 which generates outputs DP[11:0] and DN[11:0]. The ADC circuit will generate a multi-bit output associated with an analog input signal. For example, an ADC circuit may generate a 12-bit output associated with a sampled analog value. The resolution of the ADC circuit will impact the resolution of the output, and may be selected as desired. While a 12-bit output is shown, it should be understood that an analog-to-digital converter which generates a different number of bits could be implemented. Further, the block diagram of the ADC converter circuit of FIG. 16 is shown by way of example, and other ADC converter circuits could be implemented according the various embodiments.

Figure 17:
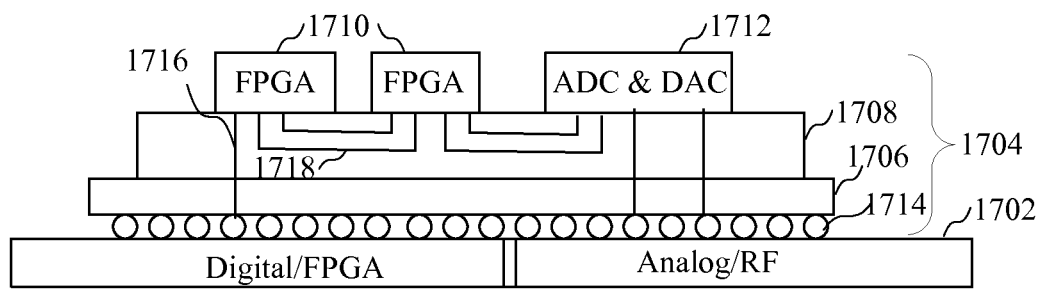
FIG. 17 is a block diagram of a multi-chip integrated circuit according to an embodiment.

Turning now to FIG. 17, a block diagram of a multi-chip integrated circuit according to an embodiment is shown. According to the embodiment of FIG. 17, a circuit board 1702, such as a printed circuit board, is configured to receive a multi-die integrated circuit 1704. The multi-die integrated circuit 1704 comprises a substrate 1706 coupled to receive an interposer circuit 1708. The interposer 1708 enables coupling multiple integrated circuit chips or die, such as FPGA chips 1710 and a data converter chip 1712 having ADC and DAC circuits, to the substrate 1706. The interposer circuit 1708 could be implemented as shown in FIG. 12 describing the interface circuit 1006. Solder balls 1714 enabling enable coupling signals from the various chips to the circuit board 1702 by way of various interconnects 1716, such as through silicon vias (TSVs). Interconnects 1718 also enable the routing of signals between the various chips of the multi-die integrated circuit. The interposer circuit 1708 may be a silicon substrate with various metal layers comprising interconnect elements enabling the routing of signals between the FPGA chips and the data converter chip or between one of the chips and the substrate 1706. However, the interposer circuit could be any material having conductive elements which enable routing signals as shown. While all of the circuits of the FPGA chips 1710 and the data converter chip 1712 could be implemented on a single die, the embodiment of FIG. 17 enables more efficiently implementing the various circuits of FPGA chips 1710 and the data converter chip 1712. For example, some circuits may be more efficiently implemented in an integrated circuit chip manufactured according to one process, such as a process forming transistors of a certain dimension, while other circuits may be implemented more efficiently in an integrated circuit chip manufactured according to another process.

Figure 18:
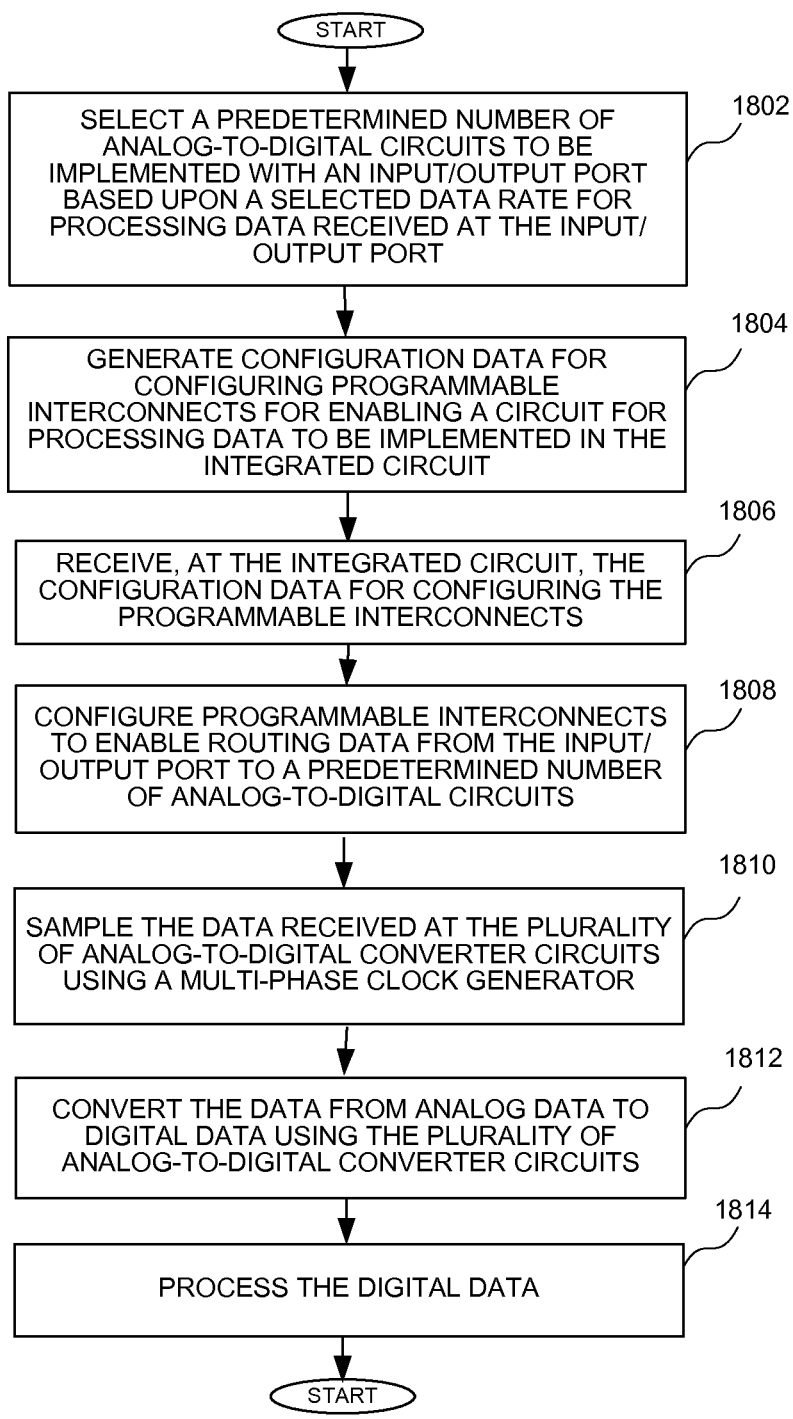
FIG. 18 is a flow chart showing a method of communicating data in an integrated circuit according to an embodiment.

Turning now to FIG. 18, a flow chart shows a method of communicating data with an integrated circuit according to an embodiment. A predetermined number of analog-to-digital circuits to be implemented with an input/output port is selected based upon a selected data rate for processing data received at the input/output port at a step 1802. Configuration data for configuring programmable interconnects for enabling a circuit for processing data to be implemented in the integrated circuit is generated at a step 1804. The configuration data for configuring the programmable interconnect circuits is received at the integrated circuit at a step 1806. Programmable interconnects are configured to enable routing data from the input/output port to the predetermined number of analog-to-digital circuits at a step 1808. Data received at the plurality of analog-to-digital converter circuits is sampled using the clock generator at a step 1810. The data is converted from analog data to digital data using the plurality of analog-to-digital converter circuits at a step 1812. The data is processed at a step 1814.

Figure 19:
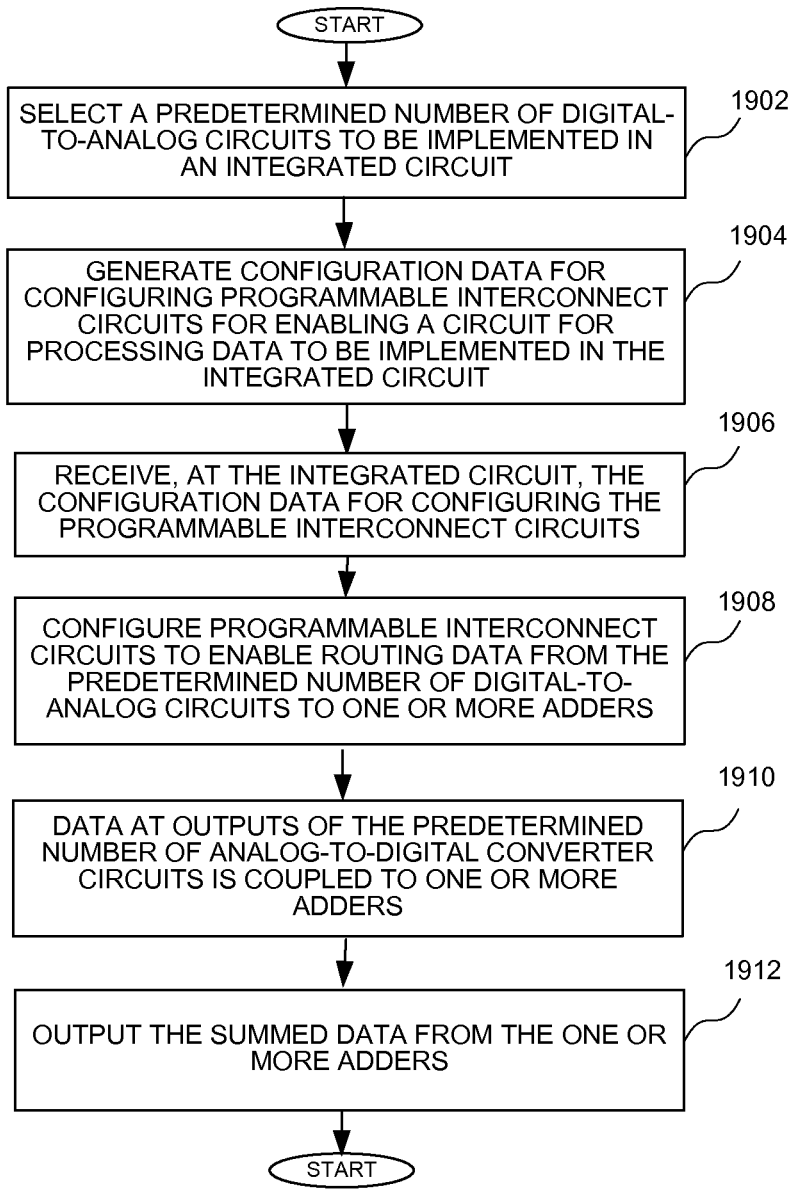
FIG. 19 is a flow chart showing a method of communicating data in an integrated circuit according to an alternate embodiment.

Turning now to FIG. 19, a flow chart shows a method of communicating data with an integrated circuit according to an alternate embodiment. A predetermined number of digital-to-analog circuits to be implemented in an integrated circuit is selected at a step 1902. Configuration data for configuring programmable interconnect circuits to enable a circuit which processes data to be implemented in the integrated circuit is generated at a step 1904. The configuration data for configuring the programmable interconnect circuits is received at the integrated circuit at a step 1906. Programmable interconnect circuits are configured to enable routing data from the predetermined number of digital-to-analog circuits to one or more summers at a step 1908. Data at outputs of the predetermined number of digital-to-analog circuits is coupled to the one or more summers at a step 1910. Summed data from the one or more summers is then output at a step 1912. The methods of FIGS. 18-19 could be implemented using the circuits of FIGS. 1-17 as described, or other suitable circuits. While specific elements of the methods of FIGS. 18-19 are shown, it should be understood that additional elements or additional details related to the elements shown are described in FIGS. 1-17.

It can therefore be appreciated that the new and novel method of communicating data with an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. An integrated circuit enabling the communication of data, the integrated circuit comprising:
   an input/output port coupled to receive an analog input signal;
   a plurality of analog-to-digital converter circuits; and
   programmable interconnect circuits coupled between the input/output port and the plurality of analog-to-digital converter circuits, the programmable interconnect circuits enabling a connection of the plurality of analog-to-digital converter circuits to the input/output port of the integrated circuit.

2. The integrated circuit of claim 1 wherein the input/output port comprises a pair of input/output pins receiving a differential analog input signal.

3. The integrated circuit of claim 1 further comprising a clock generator coupled to the plurality of analog-to-digital converter circuits, wherein each analog-to-digital converter circuit of the plurality of analog-to-digital converter circuits receives a different clock signal.

4. The integrated circuit of claim 1 wherein the plurality of analog-to-digital converter circuits are on a first die of a multi-die integrated circuit separate from a second die having programmable resources of the multi-die integrated circuit.

5. The integrated circuit of claim 4 further comprising an interconnect circuit coupled to receive the first die and the second die, the interconnect circuit enabling the communication of data between the first die and the second die.

6. The integrated circuit of claim 1 further comprising a summing circuit for generating an analog output signal based upon outputs of the plurality of digital-to-analog converter circuits.

7. An integrated circuit enabling the communication of data, the integrated circuit comprising:
   an input/output port;
   a plurality of analog-to-digital converter circuits;
   an analog-to-digital converter interface circuit coupled between the input/output port and inputs of the plurality of analog-to-digital converter circuits; and
   a clock generator enabling the plurality of analog-to-digital converter circuits to sample an analog input signal received at the input/output port.

8. The integrated circuit of claim 7 wherein the analog-to-digital converter interface circuit comprises programmable interconnect circuits, the programmable interconnect circuits enabling a connection of the plurality of analog-to-digital converter circuits to the input/output port of the integrated circuit.

9. The integrated circuit of claim 7 wherein the clock generator is coupled to receive a reference clock signal and generate a plurality of phase-shifted clock signals.

10. The integrated circuit of claim 7 wherein the integrated circuit is a multi-die integrated circuit and the plurality of analog-to-digital converter circuits are on a first die of the multi-die integrated circuit separate from a second die having programmable resources of the multi-die integrated circuit.

11. The integrated circuit of claim 10 further comprising an interconnect circuit coupled to receive the first die and the second die, the interconnect circuit enabling the communication of data between the first die and the second die.

12. The integrated circuit of claim 7 wherein the analog-to-digital converter interface circuit enables routing an analog input signal received at the input/output port to each analog-to-digital converter circuit of the plurality of analog-to-digital converter circuits.

13. The integrated circuit of claim 7 further comprising a sampler coupled to receive an analog input signal, wherein a sample of the analog input signal is coupled to a selected analog-to-digital converter circuit by way of the analog-to-digital converter interface circuit.

14. A method of communicating data with an integrated circuit, the method comprising:
   implementing a plurality of analog-to-digital converter circuits in the integrated circuit;
   coupling an analog input signal to the integrated circuit; and
   sampling, by the plurality of analog-to-digital converter circuits, the analog input signal received at an input/output port.

15. The method of claim 14 further comprising configuring programmable interconnect circuits coupled between the input/output port of the integrated circuit and the plurality of analog-to-digital converter circuits of the integrated circuit.

16. The method of claim 15 further comprising selecting the predetermined number of analog-to-digital circuits based upon a selected sample rate.

17. The method of claim 15 wherein sampling, by the plurality of analog-to-digital converter circuits, the analog input signal comprises enabling time-domain interleaving of the analog input signal received at the input/output port.

18. The method of claim 15 wherein sampling, by the plurality of analog-to-digital converter circuits, the analog input signal received at the input/output port comprises coupling the analog input signal to each analog-to-digital converter circuit of the plurality of analog-to-digital converter circuits.

19. The method of claim 14 wherein sampling, by the plurality of analog-to-digital converter circuits, the analog input signal received at the input/output port comprises periodically coupling a sample of the analog input signal to a selected analog-to-digital converter circuit of the plurality of analog-to-digital converter circuits.

* * * * *